United States Patent
Pohlers

(10) Patent No.: US 10,295,910 B2
(45) Date of Patent: May 21, 2019

(54) PHOTORESISTS AND METHODS OF USE THEREOF

(75) Inventor: Gerhard Pohlers, Needham, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 176 days.

(21) Appl. No.: 12/969,236

(22) Filed: Dec. 15, 2010

(65) Prior Publication Data

US 2011/0256481 A1 Oct. 20, 2011

Related U.S. Application Data

(60) Provisional application No. 61/286,774, filed on Dec. 15, 2009.

(51) Int. Cl.
*G03F 7/40* (2006.01)
*G03F 7/039* (2006.01)

(52) U.S. Cl.
CPC .............. *G03F 7/40* (2013.01); *G03F 7/0392* (2013.01); *G03F 7/0397* (2013.01)

(58) Field of Classification Search
None
See application file for complete search history.

(56) References Cited

U.S. PATENT DOCUMENTS

| | | | |
|---|---|---|---|
| 4,542,093 A * | 9/1985 | Suzuki et al. | 430/523 |
| 5,968,713 A * | 10/1999 | Nozaki et al. | 430/326 |
| 6,329,117 B1 * | 12/2001 | Padmanaban et al. | 430/270.1 |
| 2002/0177068 A1 * | 11/2002 | Park et al. | 430/270.1 |
| 2003/0027086 A1 * | 2/2003 | Thackeray et al. | 430/330 |
| 2004/0241579 A1 | 12/2004 | Hamada et al. | |
| 2005/0130444 A1 | 6/2005 | Rogalli et al. | |
| 2006/0019174 A1 * | 1/2006 | Ahn et al. | 430/5 |
| 2010/0304299 A1 * | 12/2010 | Dimov et al. | 430/270.1 |

FOREIGN PATENT DOCUMENTS

| | | |
|---|---|---|
| EP | 0834770 A2 | 4/1998 |
| JP | 2003-122007 A | 4/2003 |
| JP | 2004-302198 A | 10/2004 |
| JP | 2008262059 A * | 10/2008 |
| JP | 2010-186647 A | 8/2010 |
| WO | 2004092831 A2 | 10/2004 |

OTHER PUBLICATIONS

Machine-assisted English translation of JP 2008262059 A, provided by JPO. (Year: 2008).*
European Search Report of corresponding European Application No. 10 19 5059.
English Language Summary of "Notification of Decision to Refuse a Patent" in counterpart Japanese Application No. 2010-279124, Dispatch Date: Sep. 3, 2015 (3 Pages).
English Language Summary of D1, Japanese Publication No. 2008-250227 (A), Published Oct. 16, 2008 (15 Pages).
English Language Summary of D2, Japanese Publication No. 2006-189713 (A), Published Jul. 20, 2006 (15 Pages).

* cited by examiner

*Primary Examiner* — Sin J Lee
(74) *Attorney, Agent, or Firm* — Mintz Levin Cohn Ferris Glovsky and Popeo, P.C.; Peter F. Corless

(57) ABSTRACT

New photoresist are provided that comprises a low-Tg component and that are particularly useful for ion implant lithography applications. Preferred photoresists of the invention can exhibit good adhesion to underlying inorganic surfaces such as SiON, silicon oxide, silicon nitride and other inorganic surfaces.

9 Claims, No Drawings

PHOTORESISTS AND METHODS OF USE THEREOF

This application claims the benefit of priority under 35 U.S.C. § 119(e) to U.S. Provisional Application No. 61/286,774, filed Dec. 15, 2009, the entire contents of which application are incorporated herein by reference.

The invention relates to new photoresists that comprise a low-Tg component and that are particularly useful for ion implant lithography applications. Photoresists of the invention can exhibit good adhesion to underlying inorganic surfaces such as SiON, silicon oxide, silicon nitride and other inorganic surfaces.

Photoresists are photosensitive films used for transfer of images to a substrate. A coating layer of a photoresist is formed on a substrate and the photoresist layer is then exposed through a photomask to a source of activating radiation.

Ion implantation techniques have been employed for doping semiconductor wafers. By this approach, an ion beam implanter generates an ion beam within an evacuated (low pressure) chamber, and the ions are directed and "implanted" to the wafer.

Significant problems arise however with current ion implantation methods. Among other things, in implant lithography protocols, a photoresist is often not deposited on an organic underlayer, but instead deposited onto an inorganic layer such as silicon oxynitride (SiON), SiO (silicon oxide) layers and other inorganics such as $Si_3N_4$ coatings have been employed in semiconductor device manufacture, for example as an etch stop layer and an inorganic antireflective layer. See, for instance, U.S. Pat. Nos. 6,124,217; 6,153,504; and 6,245,682.

It would be desirable to have new photoresist systems that would provide good resolution and adhesion on SiON and other inorganic substrate layers.

We now provide new photoresist compositions are that preferably comprise 1) an organic low Tg component, 2) a resin that contains photoacid-labile groups, 3) and one or more photoacid generator compounds. Preferred resists of the invention are useful for short-wavelength imaging, including sub-300 nm and sub-200 nm wavelengths such as 248 nm, 193 nm and EUV.

The one or more low Tg resins for use in a photoresist of the invention may be of a variety of designs In one aspect, resins that comprise contain acrylate units are preferred. Even more particularly, acrylate rather than methacrylate resin units can be preferred to provide a low Tg resin component.

In certain aspects, a low Tg resin of a photoresist of the invention comprises polymerized units of relatively "flexible" monomers that can reduce the resin's Tg. exemplary flexible monomers include diethylene glycol methacrylate and diethylene glycol acrylate and corresponding lower alkyl (e.g. $C_{1-4}$) ethers, particularly methyl esters such as $CH_2=C(CH_3)C(O)OCH_2CH_2OCH_3$, $CH_2=CHC(O)OCH_2CH_2OCH_3$, $CH_2=CHC(O)OCH_2CH_2OCH_2CH_2OCH_3$, $CH_2=C(CH_3)C(O)OCH_2CH_2OCH_2CH_2OCH_3$, and the like; ethylene glycol methacrylate and ethylene glycol acrylate; alkyl arylates having 4 or more carbons, typically 4 to about 16 carbons, n-butyl acrylate; and hydroxy alkyl methacrylate or acrylate, where the hydroxyalkyl substituent has 1 to about 16 carbon atoms, more preferably 3 or 4 to about 16 to 20 carbon atoms; and the like.

In certain preferred aspects, a low Tg resin will be a compound that is incorporated into a photoresist composition and provide a discernable increase in adhesion of the resist to a SiON or silicon oxide surface layer. A discernable increase in adhesion is indicated by enhanced resolution relative to a control resist (same resist processed in same manner, but resist does not contain the low Tg resin). Such enhanced resolution is determined by visual inspection of scanning electron micrographs (SEMs) of the resist with candidate low Tg resin (test resist) and the control resist. Thus, a suitable low Tg resin for any given resist system can be readily identified empirically.

Suitable low Tg resins may comprise a variety of groups may be relatively low molecular weight, e.g. a weight average molecular weight of less than about 12,000, 10,000; 8,000; 7,000; 6,000; 5,000, 4,000 or even 3,000 or 2,000. Low Tg resins may be homopolymers but also suitably may be copolymers, terpolymers, tetrapolymers, pentapolymers and other higher order polymers that comprise multiple repeat units).

Preferred low Tg resins may comprise a variety of groups such as groups that comprise one or more hetero atoms (N, O and/or S).

Preferred resists of the invention can be imaged at short wavelengths, including sub-300 nm and sub-200 nm such 248 nm, 193 nm and EUV.

Particularly preferred photoresists of the invention contain a low Tg resin as disclosed herein, an imaging-effective amount of one or more photoacid generator compounds (PAGs) and a resin that is selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. No. 5,843,624 incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083.

Resists of the invention also may comprise a mixture of distinct PAGs, typically a mixture of 2 or 3 different PAGs, more typically a mixture that consists of a total of 2 distinct PAGs.

The invention also provide methods for forming relief images of the photoresists of the invention, including methods for forming highly resolved patterned photoresist images (e.g. a patterned line having essentially vertical sidewalls) of sub-quarter micron dimensions or less, such as sub-0.2 or sub-0.1 micron dimensions.

The invention further comprises articles of manufacture comprising substrates such as a microelectronic wafer having coated thereon the photoresists and relief images of the invention. The invention also includes methods to manufacture microelectronic wafers and other articles.

Additionally, as discussed, in a preferred aspect, the invention provided informed ion implantation processing. Such a process may include implanting dopant ions (e.g. Group III and/or V ions such as boron, arsenic, phosphorus and the like) into a surface of a substrate (e.g. semiconductor wafer) having thereon an organic photoresist as disclosed which serves as a mask. The resist-masked substrate may be placed in a reaction chamber which can provide reduced pressure and a plasma of ions from an ionizable source. Those ions include dopants as mentioned which are electrically active when implanted into the substrate. Voltages may be applied in the reaction chamber (such as through electrically conductive chamber walls) to selectively implant the dopant ions.

Other aspects of the invention are disclosed infra.

As discussed above, we now provide new photoresists that suitably comprise a 1) a resin component which suitably may comprise photoacid-labile groups, 2) one or more photoacid generator compounds and 3) a low Tg resin. Preferably, those components 1), 2) and 3) are distinct, i.e. not covalently linked and are each different materials. Preferred photoresists of the invention are positive-acting resists, particularly chemically-amplified resists. The invention also includes negative-acting photoresists where the resist may comprise a resin, a crosslinking function and an phenolic component as disclosed herein.

In a preferred aspects, photoresists of the invention may suitably comprise 1) a resin, 2) a photoactive component and 3) a resin having a Tg of at least about 5° C. less than the resin 1), more preferably where the resin 3) has a Tg of less than at least about 10° C. or 20° C. than the resin 1). As Tg values referred to herein, the Tg values (or differences in values) are as determined by standard Differential Scanning Calorimetry technique.

In additional preferred embodiments, photoresists of the invention may suitably comprise 1) a resin, 2) a photoactive component and 3) a resin comprising pendant hydroxy($C_{2-20}$)alkyl and/or $C_{1-20}$alkoxy moieties.

In certain preferred embodiments, the low Tg resin will be stable in a photoresist composition and not interfere with lithographic processing of the resist. That is, the low Tg resin preferably does not promote premature degradation of a resist (i.e. reduced shelf life) or necessitate alternate lithographic processing conditions.

The low Tg resin typically will be a further, distinct resist component beyond other resist components of e.g. an photoacid-labile or deblocking resin, photoacid generator, basic additive, surfactant/leveler, plasticizer, and/or solvent.

In certain aspects, suitable low Tg resin additives for use in a resist will not contain photoacid-labile moieties such as a photoacid-labile ester or acetal groups that undergo a deblocking reaction as a consequence of a photoresist exposure step.

In other aspects, preferred low Tg resin additives for use in a resist will contain photoacid-labile moieties such as a photoacid-labile ester or acetal groups that undergo a deblocking reaction as a consequence of a photoresist exposure step.

In certain preferred aspects, the photoresist will contain two distinct resins that comprise photoacid-labile groups but where the distinct resins differ in Tg values, e.g. differ by at least 5° C., 10° C. or 15° C.

The low Tg resin may provide other function to a resist composition, such as provide or enhance solvency of solid components. However, unlike other volatile solvents, a low Tg resin will remain in a resist layer in effective amounts after any pre-exposure thermal treatment, e.g. preferably at least about 10, 20, 30, 40, or 50 mole percent of the amount of the low Tg resin formulated in the liquid resist composition will remain in the resist composition after any preexposure thermal treatment. Typically, only a small amount of the low Tg resin need remain in a resist coating layer after any thermal treatments to achieve effective results, e.g. the low Tg resin may be suitably present in an amount of from about 0.05 or 0.1 weight percent to about 5 weight percent of total material of the resist layer after volatile solvent removal.

As stated herein, various substituent groups of components of resist may be optionally substituted. Substituted moieties are suitably substituted at one or more available positions by, e.g., halogen such as F, Cl Br and/or I, nitro, cyano, sulfono, alkyl including $C_{1-16}$ alkyl with $C_{1-8}$ alkyl being preferred, haloalkyl such as fluoroalkyl (e.g. trifluoromethyl) and perhaloalkyl such as perfluoro$C_{1-4}$alkyl, alkoxy including $C_{1-16}$ alkoxy having one or more oxygen linkages with $C_{1-8}$ alkoxy being preferred, alkenyl including $C_{2-12}$ alkenyl with $C_{2-8}$ alkenyl being preferred, alkenyl including $C_{2-12}$ alkenyl with $C_{2-8}$ alkynyl being preferred, aryl such as phenyl or naphthyl and substituted aryl such as halo, alkoxy, alkenyl, alkynyl and/or alkyl substituted aryl, preferably having the number of carbon atoms mentioned above for corresponding groups. Preferred substituted aryl groups include substituted phenyl, anthracenyl and naphthyl.

The photoresists of the invention typically comprise a resin binder and a photoactive component and a low Tg resin. For example, preferred are resin binders that comprise polar functional groups such as hydroxyl or carboxylate. Preferably the resin binder is used in a resist composition in an amount sufficient to render the resist developable with an aqueous alkaline solution.

In many embodiments, preferred are chemically amplified positive-acting resists. A number of such resist compositions have been described, e.g., in U.S. Pat. Nos. 4,968,581; 4,883,740; 4,810,613 and 4,491,628 and Canadian Patent Application 2,001,384.

Photoresists for use in the invention also comprise a photoactive component particularly one or more photoacid generators (i.e. "PAGs") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

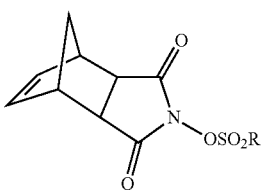

wherein R is camphor, adamantane, alkyl (e.g. $C_{1\text{-}12}$ alkyl) and fluoroalkyl such as fluoro($C_{1\text{-}18}$alkyl) e.g. $RCF_2$— where R is optionally substituted adamantyl.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

Other suitable photoacid generators for use in present photoresists include for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

A preferred optional additive of photoresist used in accordance with the invention is an added base, particularly tetramethylammonium hydroxide (TBAH), or tetramethylammonium lactate, which can enhance resolution of a developed resist relief image. For resists imaged at 193 nm, a preferred added base is a lactate salt of tetramethylammonium hydroxide as well as various other amines such as triisopropanol, diazabicyclo undecene or diazabicyclononene. The added base is suitably used in relatively small amounts, e.g. about 0.03 to 5 percent by weight relative to the total solids.

Photoresists used in accordance with the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The photoresists used in accordance with the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition. Blends of such solvents also are suitable.

Liquid photoresist compositions may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Photoresists also may be suitably applied over an antireflective layer, particularly an organic antireflective layer.

Following coating of the photoresist onto a surface, it may be dried by heating to remove the solvent until preferably the photoresist coating is tack free.

The photoresist layer is then exposed to imaging radiation. An immersion lithography process may be employed. References herein to "immersion exposing" or other similar term indicates that exposure is conducted with such a fluid layer (e.g. water or water with additives) interposed between an exposure tool and the coated photoresist composition layer.

The photoresist composition layer is suitably patterned exposed to activating radiation with the exposure energy typically ranging from about 1 to 100 $mJ/cm^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component (e.g. producing photoacid from the photoacid generator compound).

As discussed above, photoresist compositions are preferably photoactivated by a short exposure wavelength, particularly a sub-400 nm, sub-300 and sub-200 nm exposure wavelength, with I-line (365 nm), 248 nm and 193 nm being particularly preferred exposure wavelengths as well as EUV.

Following exposure, the film layer of the composition is preferably baked at temperatures ranging from about 70° C. to about 160° C. Thereafter, the film is developed, preferably by treatment with an aqueous based developer such as quaternary ammonium hydroxide solutions such as a tetraalkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc.

Photoresist and methods of the invention can be employed in a wide range of application, including e.g. in the manufacture of thin film heads (e.g. 3 to 5 μm), magnetic disks, CD masks, and back-end implants.

Also, photoresists of the invention can be useful to form metal bumps on a semiconductor wafer. Such processing can include: a) disposing on a semiconductor wafer a photoresist of the invention, preferably to provide a thick film coating layer such as a dried resist coating layer of 50 μm or greater; c) imagewise exposing the layer of photosensitive composition to actinic radiation, including sub-300 or sub-200 nm radiation particularly 248 nm and 193 nm; d) developing the exposed layer of photosensitive composition to provide patterned areas; e) depositing a metal into the patterned areas; and f) removing the exposed photosensitive composition to provide a semiconductor wafer having metal bumps.

In such bump-forming methods, the photoresist layer is imaged so as to form apertures such as vias in the photosensitive layer. In such process, the photosensitive layer is disposed on a conductive layer on the electronic device. Exposure of the photosensitive composition and subsequent development provides defined holes (vias) in the photosensitive composition and exposes the underlying conductive layer. Accordingly, the next step of the process is to deposit metal or metal alloy bumps with the defined holes (vias). Such metal deposition may be by electroless or electrolytic deposition processes. Electrolytic metal deposition is preferred. In an electrolytic metal deposition process, the electronic device substrate, i.e. semiconductor wafer, functions as the cathode.

Prior to deposition of a metal or metal alloy, such as that suitable as a solder, a conductive layer such as copper or nickel may be deposited by sputtering, electroless deposition and the like, to form the under-bump-metal. Such under-bump-metal layer is typically from 1000 to 50,000 Å in thickness and acts as a wettable foundation to the subsequently plated solder bump.

A wide variety of metals may be deposited electrolessly, including, but not limited to, copper, tin-lead, nickel, gold, silver, palladium, and the like. Suitable metals and metal alloys that may be deposited electrolytically include, but are not limited to, copper, tin, tin-lead, nickel, gold, silver, tin-antimony, tin-copper, tin-bismuth, tin-indium, tin-silver, palladium, and the like. Such metal plating baths are well known to those skilled in the art and are readily available from a variety of sources, such as Rohm and Haas.

In one embodiment, the metal deposits on the semiconductor wafer are useful as solder bumps. Accordingly, it is preferred that the metal bumps are solderable metals and metal alloys, such as tin, tin-lead, tin-copper, tin-silver, tin-bismuth, tin-copper-bismuth, tin-copper-silver, and the like. Suitable metals and metal alloys for solder bump formation are disclosed in U.S. Pat. Nos. 5,186,383; 5,902,472; 5,990,564; 6,099,713; and 6,013,572, as well as European Patent Application No. EP 1 148 548 (Cheung et al.), all of which are hereby incorporated by reference. Exemplary metals and metal alloys include, but are not limited to: tin; tin-copper alloy having less than 2% wt copper and preferably about 0.7% wt copper; a tin-silver alloy having less than 20% wt silver and preferably from 3.5 to 10% wt silver; a tin bismuth alloy having from 5 to 25% wt bismuth and preferably about 20% wt bismuth; and a tin-silver-copper alloy having less than 5% wt silver and preferably about 3.5% wt silver, less than 2% wt copper and preferably about 0.7% wt copper, and the balance being tin. In one embodiment, the metal alloys used for solder bumps are lead-free, i.e. they contain ≤10 ppm of lead.

In general, suitable electrolytic metal plating baths are acidic and contain acid, water a soluble form of the metal or metals to be deposited and optionally one or more organic additives, such as brighteners (accelerators), carriers (suppressors), levelers, ductility enhancers, wetting agents, bath stabilizers (particularly for tin-containing baths), grain refiners and the like. The presence, type and amount of each optional component varies depending upon the particular metal plating bath used. Such metal plating baths are generally commercially available.

In such a process, the resist composition functions as a protective layer to areas that are not to be plated. Following metal deposition, the remaining resist composition is stripped, such as by using a commercially available N-methylpyrrolidone ("NMP") based stripper at a temperature of about 40° to 69° C. Suitable strippers are available from a variety of commercial sources.

All documents mentioned herein are incorporated herein by reference. The following non-limiting example is illustrative of the invention.

EXAMPLE 1: RESIST PREPARATION

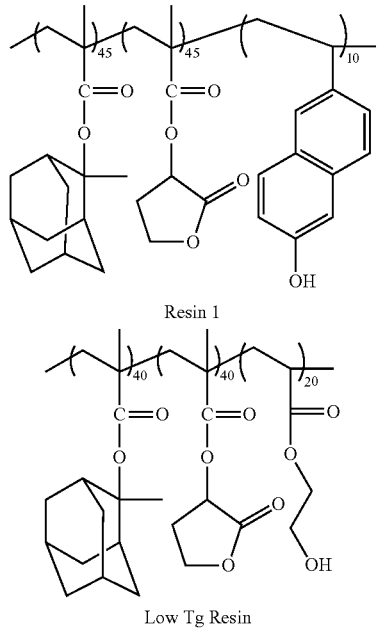

A photoresist is prepared by admixing the following components (1 through 5 below) where amounts are expressed as weight percent of total weight of the resist.

1. Resin. The resin (designated as Resin 1 in the structure immediately above) of the photoresist is shown above where numbers to the right of each repeat unit of the terpolymer represent weight amount of the unit in the terpolymer (by monomer loading during the resin synthesis). This resin is present in an amount of 12.0 weight percent of the total weight of the fluid photoresist.

2. Photoacid generator compound (PAG). The PAG is t-butyl phenyl tetramethylene sulfonium perfluorobutanesulfonate present in 2.5 weight percent of the total weight of the fluid photoresist.

3. Basic additive. The basic additive is N-Alkyl Caprolactam in an amount of 0.017 weight % based on total weight of the photoresist composition.

4. Low Tg resin. The low Tg resin of the photoresist is shown above where numbers to the right of each repeat unit of the terpolymer represent weight amount of the unit in the terpolymer (by monomer loading during the resin synthesis). This low Tg resin is present in an amount of 8 weight percent of the total weight of the fluid photoresist.

5. Solvent. The solvent is ethyl lactate to provide balance of resist.

EXAMPLE 2: LITHOGRAPHIC PROCESSING

The formulated resist composition of Example 1 is spin coated onto a SiON wafer surface and softbaked via a vacuum hotplate at 90° C. for 60 seconds. The resist coating layer is exposed through a photomask at 193 nm, and then the exposed coating layers are post-exposure baked at 110° C. The coated wafers are then treated with 0.26N aqueous tetrabutylammonium hydroxide solution to develop the imaged resist layer.

After formation of the photoresist relief image, the substrate (with resist mask) is exposed to high energy (>20 eV, reduced pressure environment) phosphorus-ion implant processing.

What is claimed is:

1. A method for providing an ion-implanted semiconductor substrate comprising:

providing a semiconductor substrate having coated thereon a relief image of chemically-amplified positive-acting photoresist composition, wherein the photoresist comprises 1) a resin, 2) a photoactive component and 3) a resin having a Tg of at least about 5° C. less than the resin 1), and wherein the resin 3) comprises polymerized units of diethylene glycol methacrylate and/or diethylene glycol acrylate; and applying ions to the substrate.

2. The method of claim 1 wherein the resin 3) has a weight average molecular weight of about 8,000 or less.

3. The method of claim 1 wherein the resin 3) has a weight average molecular weight of about 5,000 or less.

4. The method of claim 1 wherein the resin 3) has a weight average molecular weight of less than 5000.

5. The method of claim 1 wherein the resin 3) has a weight average molecular weight of less than 3000.

6. The method of claim 1 wherein the resin 3) has a weight average molecular weight of less than 2000.

7. The method of claim 1 wherein the resin 1) and the resin 3) that each comprise photoacid acid labile groups.

8. The method of claim 1 where the resin 3) has a Tg of at least about 10° C. less than the resin 1).

9. The method of claim 1 where the resin 3) has a Tg of at least about 15° C. less than the resin 1).

* * * * *